United States Patent
Gautama et al.

(10) Patent No.: US 10,436,828 B2
(45) Date of Patent: Oct. 8, 2019

(54) LOAD DETECTOR

(71) Applicant: NXP B.V., Eindhoven (NL)

(72) Inventors: Temujin Gautama, Boutersem (BE); Remko van Heeswijk, Oss (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/118,995

(22) Filed: Aug. 31, 2018

(65) Prior Publication Data
US 2019/0128935 A1    May 2, 2019

(30) Foreign Application Priority Data
Nov. 1, 2017 (EP) ..................... 17199504

(51) Int. Cl.
| | |
|---|---|
| *G01R 27/16* | (2006.01) |
| *H03F 3/183* | (2006.01) |
| *G01R 27/08* | (2006.01) |
| *H04R 29/00* | (2006.01) |
| *H03F 3/181* | (2006.01) |
| *H03F 3/217* | (2006.01) |
| *H04R 5/04* | (2006.01) |

(52) U.S. Cl.
CPC ............. *G01R 27/16* (2013.01); *G01R 27/08* (2013.01); *H03F 3/181* (2013.01); *H03F 3/183* (2013.01); *H03F 3/217* (2013.01); *H04R 5/04* (2013.01); *H04R 29/001* (2013.01); *H03F 2200/03* (2013.01); *H03F 2200/129* (2013.01); *H03F 2200/331* (2013.01); *H03F 2200/462* (2013.01); *H03F 2200/471* (2013.01)

(58) Field of Classification Search
CPC ......... G01R 27/16; G01R 27/08; H03F 3/183; H03F 2200/03; H03F 2200/129; H03F 3/181; H03F 3/217; H03F 3/22; H03F 3/331; H03F 2200/462; H03F 2200/471; H04R 29/001; H04R 5/04
See application file for complete search history.

(56) References Cited

U.S. PATENT DOCUMENTS

| | | | |
|---|---|---|---|
| 8,319,507 B2 | 11/2012 | Gautama | |
| 8,538,032 B2 | 9/2013 | Woelfl et al. | |
| 9,398,388 B2 * | 7/2016 | Botti | ............... H04R 29/001 |

(Continued)

FOREIGN PATENT DOCUMENTS

| | | |
|---|---|---|
| EP | 2763433 A1 | 8/2014 |
| JP | H09307988 A | 11/1997 |

*Primary Examiner* — Andrew L Sniezek

(57) ABSTRACT

A load detector for an audio system comprising a closed-loop amplifier is described. The load detector includes a noise detector configured to be coupled to the output of the closed-loop amplifier. The noise detector detects a noise signal at least partially generated by the amplifier. The generated noise signal comprises frequencies outside the audible frequency range due to the noise shaping of the amplifier. The load detector further includes a parameter calculation module having an input coupled to the output of the noise detector and an output. The parameter calculation module is configured to determine a parameter value relating to an impedance of the amplifier output load from the detected noise signal and to output a load detection signal dependent on the determined parameter value. The load detector may detect the presence of a load such as a tweeter without generating a reference signal.

20 Claims, 5 Drawing Sheets

(56) References Cited

U.S. PATENT DOCUMENTS

| | | | |
|---|---|---|---|
| 9,525,937 B2 * | 12/2016 | Zhang | H04R 3/002 |
| 2005/0175195 A1 * | 8/2005 | Cheney, Jr. | G01R 31/041 |
| | | | 381/120 |
| 2008/0042746 A1 | 2/2008 | Kozak et al. | |
| 2016/0165348 A1 * | 6/2016 | Ilango | H04R 29/001 |
| | | | 381/59 |

* cited by examiner

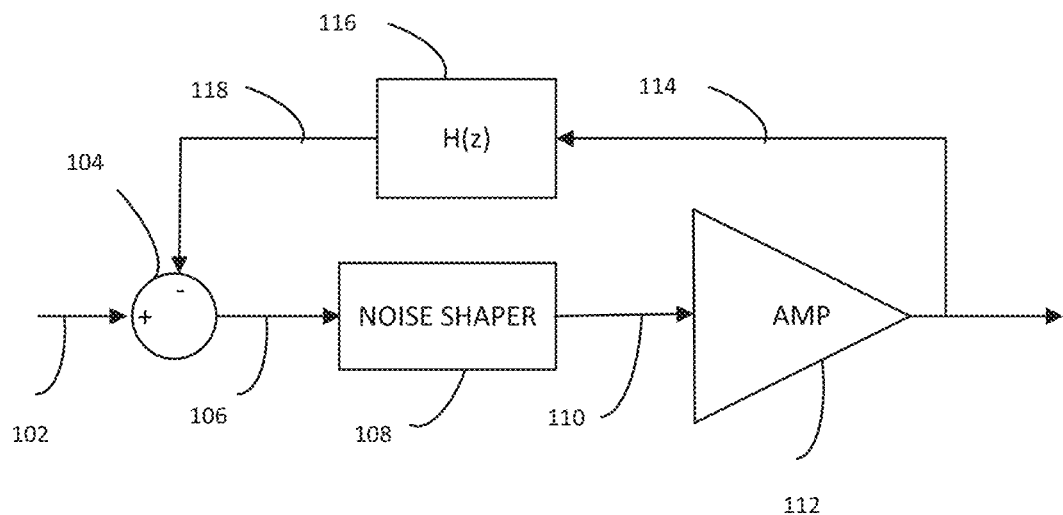
100
FIGURE 1
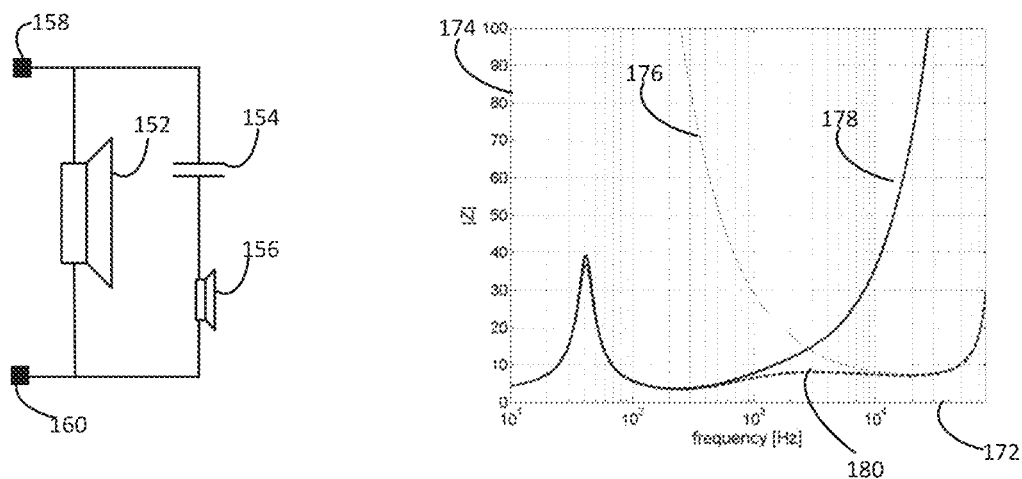
150
FIGURE 2A
—PRIOR ART—
170
FIGURE 2B

LOAD DETECTOR

CROSS-REFERENCE TO RELATED APPLICATIONS

This application claims the priority under 35 U.S.C. § 119 of European Patent application no. 17199504.6, filed on Nov. 1, 2017, the contents of which are incorporated by reference herein.

FIELD

This disclosure relates to a load detector for an audio system including a closed loop amplifier.

BACKGROUND

Audio systems may detect the presence or absence of a load by playing a reference signal, determining the current signal that flows into the audio system load which typically includes one or more speakers, computing the ratio between the detected voltage and detecting the current at the reference signal frequency. Based on the measured impedance, the presence or absence of a load may be determined.

SUMMARY

Various aspects of the disclosure are defined in the accompanying claims. In a first aspect, there is defined a load detector for an audio system comprising a closed-loop amplifier including a noise shaper, the load detector comprising: a noise detector configured to be coupled to the output of the closed-loop amplifier and to detect a noise signal at least partially generated by the amplifier, the noise signal comprising frequencies outside the audible frequency range; and a parameter calculation module having an input coupled to the output of the noise detector and an output, wherein the parameter calculation module is configured to determine a parameter value relating to an impedance of the amplifier output load from the detected noise signal and to output a load detection signal dependent on the determined parameter value.

In one or more embodiments, the parameter value may be determined from the detected noise signal in a frequency region above the audible audio band.

In one or more embodiments, the noise detector comprises at least one of a voltage detector and a current detector and is configured to detect the noise signal by detecting at least one of the amplifier output current and output voltage and wherein the parameter calculation module is configured to determine the parameter value from at least one of the detected current and the detected voltage.

In one or more embodiments, the parameter calculation module is configured to compare the parameter value with a predetermined threshold value and to output the load detection signal dependent on the comparison.

In one or more embodiments, the parameter calculation module is further configured to determine a current value from the detected current and to determine the parameter value from the current value and a predetermined voltage value.

In one or more embodiments, the parameter calculation module further comprises an impedance calculator having an input coupled to the parameter calculation module input and a comparator having a first comparator input coupled to the impedance calculator output and a second comparator input coupled to a memory configured to store a reference parameter value, wherein the parameter calculation module is further configured to generate the load detection signal by comparing the parameter value with the reference parameter value.

In one or more embodiments, the controller is further configured to determine a voltage value from the detected voltage and to determine the parameter value from the voltage value and a predetermined voltage value.

In one or more embodiments, the load detector configured to generate a load detection signal in response to at least one of no load being detected and no tweeter being detected.

Embodiments of the load detector may be included in an audio system comprising a closed-loop amplifier having an output coupled to the load detector.

The audio system may comprise an audio processor having an input for receiving an audio signal and an output coupled to the closed-loop amplifier, wherein the audio processor is configured to modify the received audio signal in response to the load detection signal.

In a second aspect there is described a method for detecting a load coupled to a closed-loop amplifier including a noise shaper, the method comprising: detecting a noise signal at least partially generated by the amplifier; determining a parameter relating to the impedance of a load connected to the amplifier from the detected noise signal; wherein the noise signal comprises frequencies exceeding the audio frequency band; and wherein a load detection signal is generated dependent on the determined parameter value.

In one or more embodiments, detecting the noise signal comprises measuring at least one of an amplifier output current and amplifier output voltage.

In one or more embodiments, determining the parameter value comprises determining a current value from the detected current at one or more frequencies above the audible frequency range.

In one or more embodiments, determining the parameter value comprises determining a voltage value from the detected voltage at one or more frequencies above the audible frequency range.

In one or more embodiments, the method may further comprise comparing the parameter value with at least one reference parameter value and generating a load detection output signal dependent on the comparison.

In a third aspect, there is described a computer program product comprising instructions which, when being executed by a processing unit, cause said processing unit to perform the steps of detecting a load coupled to a closed-loop amplifier including a noise shaper by detecting a noise signal at least partially generated by the amplifier, the noise signal comprising frequencies exceeding the audible frequency range; determining a parameter relating to the impedance of a load connected to the amplifier from the detected noise signal; and generating load detection signal is generated dependent on the determined parameter value.

In the figures and description like reference numerals refer to like features. Embodiments are now described in detail, by way of example only, illustrated by the accompanying drawings in which:

FIG. 1 shows an example closed loop audio class-D amplifier.

FIG. 2A shows an example speaker arrangement.

FIG. 2B shows a graph illustrating an example response of the speaker arrangement of FIG. 2A.

DESCRIPTION

Figure 3:
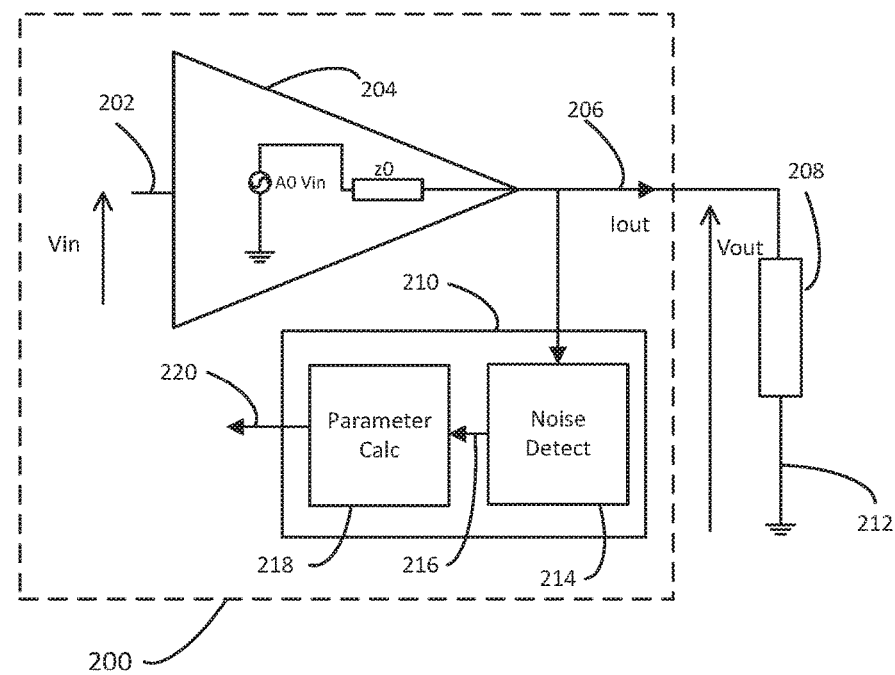
FIG. 3 illustrates an audio system including a load detector according to an embodiment.

FIG. 1 shows an example of a closed-loop class D amplifier 100. Audio input 102 may be connected to a subtractor 104. An output of the subtractor may be connected to an input 106 of a noise shaper 108. An output 110 of the noise shaper 108 may be connected to an input of a class-D amplifier circuit 112. An output 114 of the class D amplifier circuit 112 may be connected to a feedback network 116. An output 118 of the feedback network 116 may be connected to the subtractor 104.

In operation an input signal received on the audio input 102 may be noise shaped by the noise shaper 108. The noise shaper may shift noise to out of band frequencies above the audible frequency range. The audio signal at the noise shaper output 110 may be amplified by the class-D amplifier 112. The class D amplifier 112 may output a single ended signal or a differential signal on the amplifier output 114. The audio output signal may also be input to the feedback network 116. The output 118 of the feedback network 116 may be subtracted from the incoming audio signal by the subtractor 104. The negative feedback loop typically improves the stability and linearity of the amplifier 100.

It will be understood in general that a closed-loop amplifier may be any amplifier with negative feedback and which includes noise shaping. The feedback typically improves the linearity of the amplifier. The amplifier circuit may be a class-D amplifier, a class-AB amplifier, a class-G amplifier, or a class-H amplifier.

FIG. 2A shows a typical loudspeaker system 150 which may be connected to a class-D amplifier or other audio amplifier output. A series tweeter circuit of a capacitor 154 and a. tweeter 156 is connected between a first terminal 158 and second terminal 160. The capacitor 154 acts as a high-pass filter for an audio signal transmitted to the tweeter. The main loudspeaker 152 is connected between a first terminal 158 and second terminal 160 and so is arranged in parallel with the tweeter circuit. When driven by an amplifier with a differential output or two amplifiers connected in bridge-tied-load (BTL) configuration the first terminal 158 may be connected to first differential output and second terminal 160 may be connected to second differential output. For a single-ended configuration, the first terminal 158 may be connected to the amplifier output and the second terminal 160 may be connected to a ground. The loudspeaker system 150 only requires a single amplifier to drive both a main loudspeaker and a tweeter and the tweeter only receives frequencies above a certain 'cross-over' frequency.

To detect the presence of a tweeter in the loudspeaker system 150 that is connected to an audio amplifier, the impedance of the total load of the amplifier can be determined. Since the tweeter 156 is connected in parallel to the main loudspeaker 152, the impedance is expected to be lower at high frequencies. The voice coil of the main loudspeaker 152 has a high impedance at high audio frequencies since the inductance dominates its impedance. The voice coil of the tweeter 156 has a relatively low impedance at high audio frequencies. Therefore the overall load impedance of a main loudspeaker 152 in parallel with an AC coupled tweeter 156 is dominated by the tweeter at high frequencies.

FIG. 2B shows simulated impedance curves 170 of the loudspeaker system 150. The x-axis 172 shows frequencies on a logarithmic scale varying from 10 Hz to 80 KHz. The y-axis 174 shows the magnitude of the impedance varying from 0 to 100 Ohms, Line 178 shows the impedance curve of the main loudspeaker. Line 176 shows the impedance curve of the tweeter 156 with the series capacitor 154. Line 180 shows the impedance curve of the total loudspeaker system 150. It can be observed that for frequencies above, for example 5 KHz, a clear difference in impedance magnitude can be observed in the presence or absence of the tweeter branch. For example, at 10 KHz the total impedance is less than 10 Ohms, and the impedance of the main speaker 152 alone, corresponding to the situation where the capacitance 154 and the tweeter 156 are absent, is approximately 40 Ohms.

FIG. 3 shows an audio system 200 including a load detector 210 according to an embodiment. The load detector 210 may include a noise detector 214 and a parameter calculation module 218. The audio system 200 may further include a closed-loop class-D amplifier 204 which has an amplifier input 202 for receiving a desired audio signal and an amplifier output 206. The closed-loop class-D amplifier 204 as shown may be modelled as an ideal voltage amplifier having an input voltage Vin, an output voltage Vout of A0×Vin, where A0 is the gain, and a series output impedance z0. In operation, the amplifier output 206 may be connected to a first terminal of load 208 which typically includes one or more loudspeakers. A second terminal of the load 208 may be connected to a ground connection 212. The voltage across the load 208 corresponding to the amplifier output voltage is shown as Vout. The current flowing through the load 208 is denoted Iout corresponding to the amplifier output current.

The load detector 210 may have an input connected to the amplifier output 206 and a load detector output 220. The noise detector 214 may have an input connected to the amplifier output 206. The noise detector 214 may have a noise detector output 216 connected to an input of a parameter calculation module 218. The parameter calculation module 218 may have an output connected to the load detector output 220.

In operation, the noise detector 214 may detect a current and/or voltage due to at least high frequency noise above the audible frequency range which may be referred to as out-of-band noise, for example above 20 KHz, which is at least partly generated by the closed-loop class-D amplifier 204. The impedance in the high-frequency region can be determined on the basis of the voltage, Vout, at the output terminal of the amplifier and the current flowing into the load, Iout. By detecting Vout and Iout at least partially in the high-frequency region, the parameter calculation module 218 may determine the impedance at one or more frequencies where the high-frequency noise is present. The magnitude or the phase of the determined impedance may indicate the presence or absence of a connected load. In this way, the parameter calculation module 218 may determine a parameter value relating to the impedance for the detected noise.

The parameter calculation module 218 may determine the impedance magnitude in the high frequency regions from the detected current only. The impedance magnitude in the high-frequency region may be determined by assuming the voltage magnitude is known and constant, since this magnitude does not depend on the audio due to the stationary character of the out-of-band noise. In this case, the impedance magnitude can be estimated as the ratio between a predetermined reference voltage amplitude and the magnitude of the current, The parameter calculation module 218 may determine the impedance magnitude in the high frequency regions from the detected voltage only. The voltage drop across the output impedance may be used for deriving a signal that is related to the current flowing into the load. Therefore, the voltage at the output terminal will be highest when there is no load connected (and the voltage drop across the internal impedance is minimal). When a load such as a single loudspeaker is connected, the voltage drop will reduce. When a load such as a loudspeaker in parallel with a tweeter connected in parallel as illustrated for example in loudspeaker system 150 is connected, the voltage drop may reduce further compared to a single loudspeaker. The detected voltage may be used as a parameter to indicate the impedance. By comparing the detected voltage with one or more predetermined voltage values, the load detector 210 may detect the presence or absence of a load. In some vehicle audio systems if the absence of a load such as a tweeter is detected, the absence of the tweeter may be logged in a flash memory such that the defect can be repaired. For safety critical applications the absence of a loudspeaker or tweeter may be used to visually inform the driver that safety and comfort functions which use the loudspeaker are disabled. Example safety and comfort features include but are not limited to park pilot or reversing detectors.

The load detector 210 may generate a signal on the load detector output 220 dependent on the magnitude or phase of the impedance. The load detector output signal may indicate the presence or absence of a load 208.

The inventors of the present disclosure have appreciated that in closed-loop amplifiers, the noise may be shaped so that it is pushed beyond the audio band, resulting in out-of-band noise. As a result, there is signal energy present in a high frequency region for example above 40 KHz, which is substantially unrelated to and independent of the input signal including the desired audio content. Furthermore, this signal energy is stationary in both frequency content and amplitude.

Since the out-of-band noise is continuously present and stationary, it results in a sustained, relatively small excitation of the load in that frequency region. This excitation means that a current is continuously flowing into the load. The inventors have further appreciated that the out-of-band noise may be detected and used to estimate a parameter value relating to a load impedance in that frequency region. This parameter value may be for example the output current Iout or output voltage Vout at a particular frequency or range of frequencies. The load impedance may be determined in the frequency region based on a measurement of at least one of the voltage Vout and the current Iout at the output terminal of the amplifier 204.

The parameter value relating to an impedance at least in a higher frequency region, for example including frequencies above 20 KHz, may be used to determine whether or not a speaker is connected. Alternatively, or in addition by detecting the noise and determining a parameter value relating to impedance from the detected noise, the load detector 210 may indicate whether a tweeter circuit is connected as part of a loudspeaker system.

The load detector 210 of the present disclosure may allow the presence or absence of a load to be detected without having to generate a reference signal or a test signal.

The load detector 210 may be implemented in hardware or as a combination of hardware and software which may be executed by a microprocessor, digital signal processor or other programmable hardware. The noise detector 214 may be implemented as a combination of hardware and software executed by a microprocessor, digital signal processor or other programmable hardware. The parameter calculation module 218 may be implemented as hardware, software or a combination of hardware and software.

Figure 4:
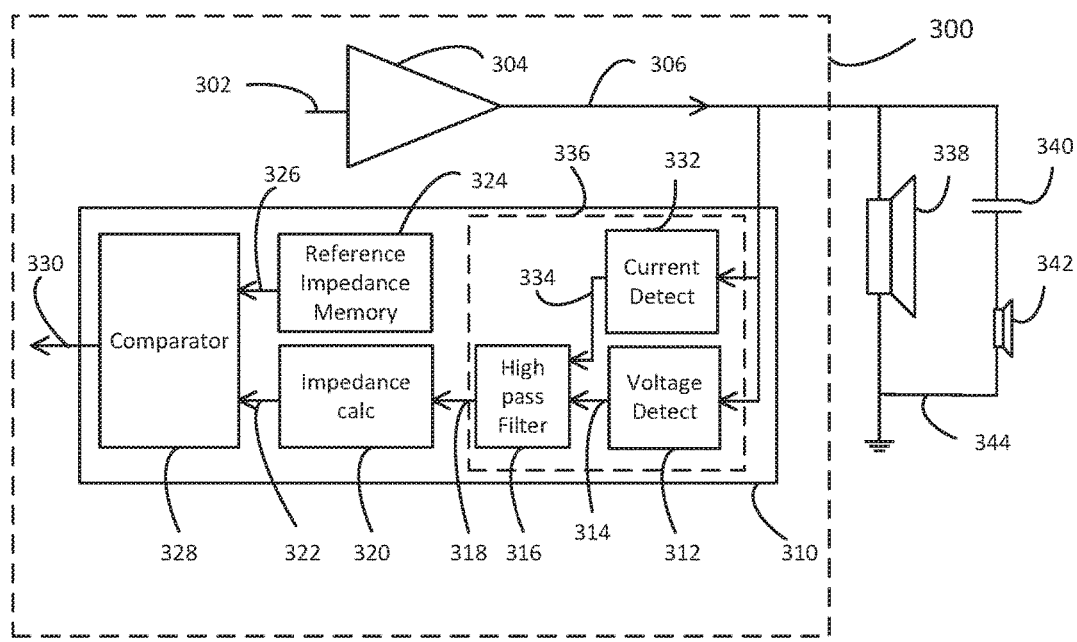
FIG. 4 shows an audio system including a load detector according to an embodiment.

FIG. 4 shows an audio system 300 including a load detector 310 according to an embodiment. Audio system 300 further includes a closed-loop class-D amplifier 304 which has an amplifier input 302 and an amplifier output 306.

The load detector 310 may have a noise detector 336 including a current detector 332, a voltage detector 312 and a high pass filter 316. The load detector 310 may further include a memory 324 which stores a reference value, an impedance calculation module 320 and a comparator 328.

The current detector 332 may have an input connected to the amplifier output 306. The current detector 332 may have a current detector output 334 connected to a first input of high pass filter 316. The voltage detector 312 may have an input connected to the amplifier output 306. The voltage detector 312 may have a voltage detector output 314 connected to a second input of high pass filter 316. The high pass filter 316 may have an output 318 connected to an input of the impedance calculation module 320. The impedance calculation module output 322 may be connected to a first input of the comparator 328. The reference impedance memory 324 may have an output 326 connected to a second input of the comparator 328. The comparator output may be connected to the load detector output 330.

The audio system 300 may be connected to a load including a loudspeaker system. The loudspeaker system may include a tweeter circuit having a series arrangement of a capacitor 340 and a tweeter 342 connected between the amplifier output 306 and a ground 344. The load may include a further loudspeaker 338 connected between the amplifier output 306 and a ground 344.

In operation of the load detector 310, the current detector 332 and the voltage detector 312 may measure a respective current and voltage signal. The high pass filter 316 may filter out the in-band signals for example below 20 KHz. In other examples, the in-band signals may have frequencies below 40 KHz. The filtered current and voltage signals may be output on the high pass filter output 318. The impedance calculation module 320 may determine an impedance magnitude and/or phase value from the filtered voltage and current signals. The comparator 328 may compare the determined impedance value with one or more predetermined impedance values and generate an output signal depending on the comparison result. The impedance calculation module 320 and the comparator 328 may form part of a parameter calculation module. In some cases, for example when the detected current is used directly from the noise detector 336, the impedance calculation module 320 may be omitted. Since the expected characteristics of a load connected to the audio system 300 are typically known beforehand, the load detector 310 may for example determine if a load is connected.

In some audio systems, the expected load may be a speaker system including a tweeter circuit. If the magnitude of the impedance is determined at one or more frequencies of above 20 to be greater than 40 Ohms, then this may indicate that no tweeter circuit is connected. The load detector may also determine whether a speaker is connected indicating a potential fault. In some examples, if the magnitude of the impedance is determined at one or more frequencies of above 20 KHz to be greater than 200 Ohms then this may indicate that no speaker is connected which may indicate a fault.

The audio system 300 may include an audio processor (not shown) having an input connected to the load detector output 330 and an output connected to the amplifier input 302. In response to the load detector indicating no tweeter circuit is present, the audio processor may adapt the processing of the audio signal prior to the amplifier, for example by output gain matching and equalization. In response to the load detector 310 indicating no load is present, the audio processor may block the audio signal from reaching the closed-loop class-D amplifier 304.

For diagnostics during normal operation, it may also be desirable to detect the presence and type of a load. This may be necessary if the audio system is part of a driver assistance system in a car or other motor vehicle.

By determining a parameter value relating to impedance from the detected noise, the load detector 310 may determine whether or not a load is connected without a reference or test signal. The load detector 310 may also determine whether or not a tweeter circuit is included in a speaker system without a reference or test signal. In some example load detectors, if only voltage or current is detected and used to determine the parameter value relating to impedance, then either the current detector 304 or the voltage detector 312 may be omitted. In other examples, the high pass filter 316 may be omitted. By avoiding the use of a reference or test signal, the power consumption of the audio system may be reduced. Furthermore, using a reference or test signal may be audible to some animals which may be undesirable for audio systems included in cars or other motor vehicles.

Figure 5:
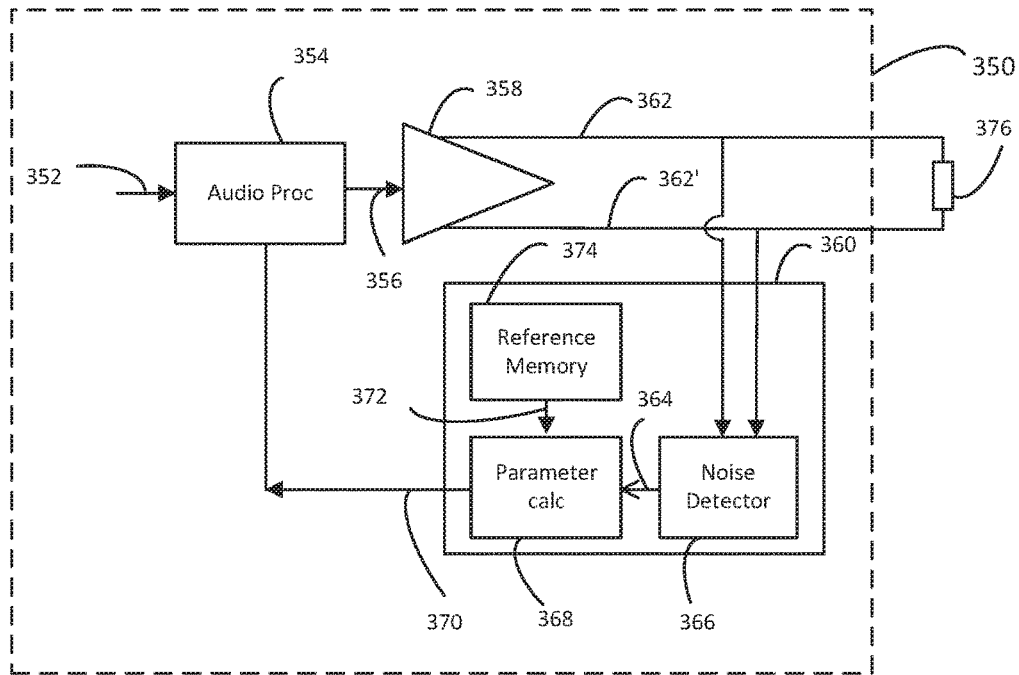
FIG. 5 illustrates an audio system including a load detector according to an embodiment.

FIG. 5 shows an audio system 350 including a load detector 360 according to an embodiment. The load detector 360 may include a noise detector 366, a parameter calculation module 368 and a reference memory 374. The audio system 350 may further include a closed-loop amplifier 358 which has an amplifier input 356 for receiving a desired audio signal and two differential amplifier outputs 362, 362'. The amplifier 358 may be a single differential amplifier circuit or two amplifier circuits in a bridge tied load configuration. The amplifier 358 may be a class-D amplifier. In operation, the amplifier outputs 362, 362' may be connected to a respective terminal of a load 376 which typically includes one or more loudspeakers. The voltage across the load 376 may correspond to the amplifier output voltage difference between differential outputs 362, 362'. The current flowing through the load 376 may correspond to the amplifier output current.

The load detector 360 may have a first input connected to the amplifier output 362, a second input connected to the second amplifier output 362', and load detector output 370. The noise detector 366 may have a first and second input connected to the first and second load detector inputs. The noise detector 366 may have a noise detector output 364 connected to a first input of a parameter calculation module 368. A second input of parameter calculation module 368 may be connected to an output 372 of the reference memory 374. The parameter calculation module 368 may have an output connected to the load detector output 370. The audio system 350 may further include an audio processor 354. The audio processor 354 may having an audio processor input 352, a control input connected to the load detect output 370 and an audio processor output connected to the amplifier input 356.

In operation, the noise detector 360 may detect a current and/or voltage due to at least high frequency noise above the audible frequency range, for example above 20 KHz, which is generated by the closed-loop amplifier 358. The parameter calculation module 368 may determine a parameter value relating to the impedance from the detected current and/or voltage. The parameter calculation module 368 may compare the determined parameter value to one or more reference values stored in the reference memory 374. Based on the comparison, the parameter calculation module 368 may output a load detection signal on the load detector output 370. The load detection signal may indicate the presence or absence of a load 376. Alternatively or in addition, if the expected load includes multiple speakers, the load detection signal may indicate the presence or absence of a speaker such as a tweeter.

The parameter calculation module 368 may determine a parameter value representing the impedance magnitude in the high frequency regions from detected current only. The impedance magnitude in the high-frequency region may be determined by assuming the voltage magnitude is known and constant, since this magnitude does not depend on the audio due to the stationary character of the out-of-band noise. In this case, the impedance magnitude can be estimated as the ratio between a predetermined reference voltage amplitude and the magnitude of the current. Consequently, the detected current may be used as a parameter to indicate impedance. The parameter calculation module 368 may compare the detected current value to a reference current value stored in the reference memory 374. Based on the comparison, the parameter calculation module 368 may output a load detection signal on the load detector output 370. The load detection signal may indicate the presence or absence of a load 376. Alternatively or in addition, the load detection signal may indicate the presence or absence of a tweeter.

The parameter calculation module 368 may determine a parameter value representing the impedance magnitude in the high frequency region from the detected voltage only. The voltage drop across the output impedance may be used for deriving a signal that is related to the current flowing into the load. Therefore, the voltage across the amplifier outputs 362, 362' will be highest when there is no load connected and the voltage drop across the internal impedance is minimal. When a load such as a single loudspeaker is connected, the voltage drop will reduce. When a load such as a loudspeaker in parallel with a tweeter as illustrated for example in loudspeaker system 150, the voltage drop may reduce further compared to a single loudspeaker. The detected load voltage may be used as a parameter to indicate the impedance. The parameter calculation module 368 may compare the detected current value to a reference current value stored in the reference memory 374. Based on the comparison, the parameter calculation module 368 may output a load detection output signal on the load detector output 370. The load detection signal may indicate the presence or absence of a load 376. The load detection signal may indicate the presence or absence of a load 376. Alternatively, or in addition, the load detection output signal may indicate the presence or absence of a tweeter.

By determining a parameter value relating to impedance from the detected noise, the load detector 360 may determine whether or not a load is connected without a reference or test signal. The load detector 360 may also determine whether or not a tweeter circuit is connected without a reference or test signal. The load detector may allow continuous detection of loudspeakers for functional safety related applications. The load detector may operate continuously or sampled within time intervals of, for example, 1 ms.

The audio processor 354 may perform operations such as filtering, equalization or dynamic range compression on a desired audio signal received on audio processor input 352. The processed audio signal may be output on the audio processor output. If the load detection signal indicates that no load is connected, the audio processor 354 may block the audio input signal, effectively muting the audio system 350. If the load detection signal indicates that a speaker is connected but a tweeter circuit is not connected, the audio processor 354 may adapt the audio input signal, for example by boosting some of the high frequencies in the desired audio signal.

Figure 6:
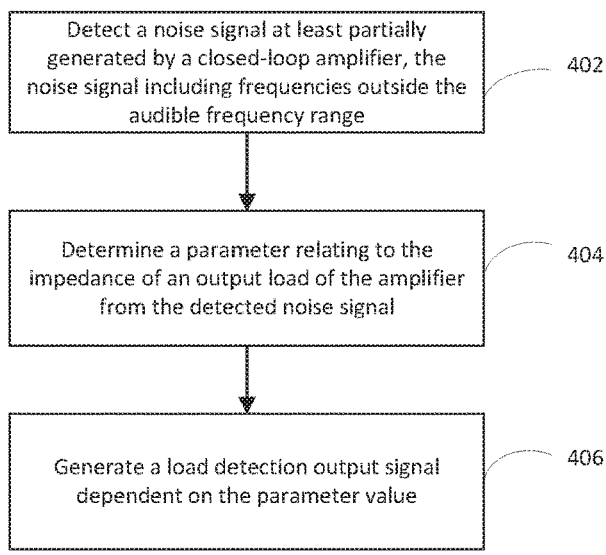
FIG. 6 shows a method of load detection for an audio system including a closed-loop class-D amplifier.

FIG. 6 illustrates a method of load detection 400 for an audio system including a closed-loop amplifier. In step 402 a noise signal is detected at least partially generated by a closed-loop amplifier, the noise signal including frequencies outside the audible frequency range. In step 404 a parameter relating to the impedance of an output load of the amplifier may be determined from the detected noise signal. This parameter value may be a value of current and/or voltage measured at one or more frequencies above the audible frequency range. In step 406, a load detection output signal may be generated dependent on the parameter value.

In some examples, if both current and voltage are detected, a value of impedance may be determined and compared to one or more reference values. For example, if the parameter value is above a first reference value, then the load detection output signal may indicate that no load is detected. If the parameter value is below a first reference value but above a second reference value, then the load detection output signal may indicate that no tweeter is connected.

Figure 7:
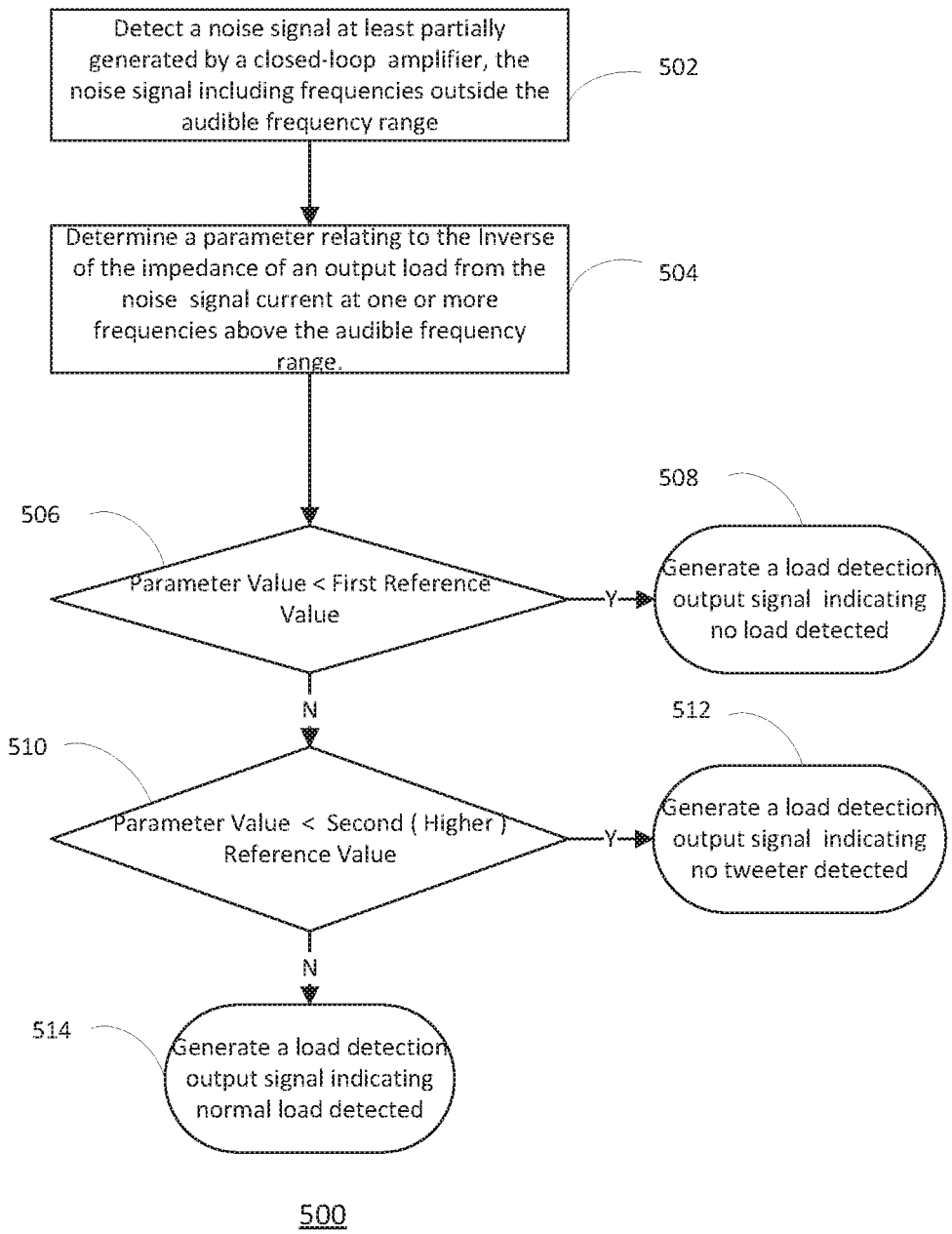
FIG. 7 shows a method of load detection for an audio system including a closed-loop class-D amplifier.

FIG. 7 illustrates a method of load detection from a noise current signal 500 for an audio system including a closed-loop amplifier. The closed loop amplifier may be a class-D audio amplifier. In step 502 noise signal is detected at least partially generated by a closed-loop amplifier, the noise signal including frequencies outside the audible frequency range. In step 504 a parameter relating to the inverse of the impedance of an output load of the amplifier may be determined from the detected noise signal current. This parameter value may be a value of current measured at one or more frequencies above the audible frequency range.

In step 506, a comparison may be made between the parameter value and a first reference value corresponding to a first threshold current value. If the parameter value is less than the first reference value, a load detection output signal may be generated indicating no load is detected in step 508. If the parameter value is not less than the first reference value the method moves to step 510.

In step 510 a comparison may be made between the parameter value and a second reference value corresponding to a second higher threshold current value. If the parameter value is less than the second reference value, a load detection output signal may be generated indicating no tweeter is detected in step 512. If the parameter value is not less than the second reference value the method moves to step 514, and a load detection output signal may be generated indicating a normal load is detected.

Figure 8:
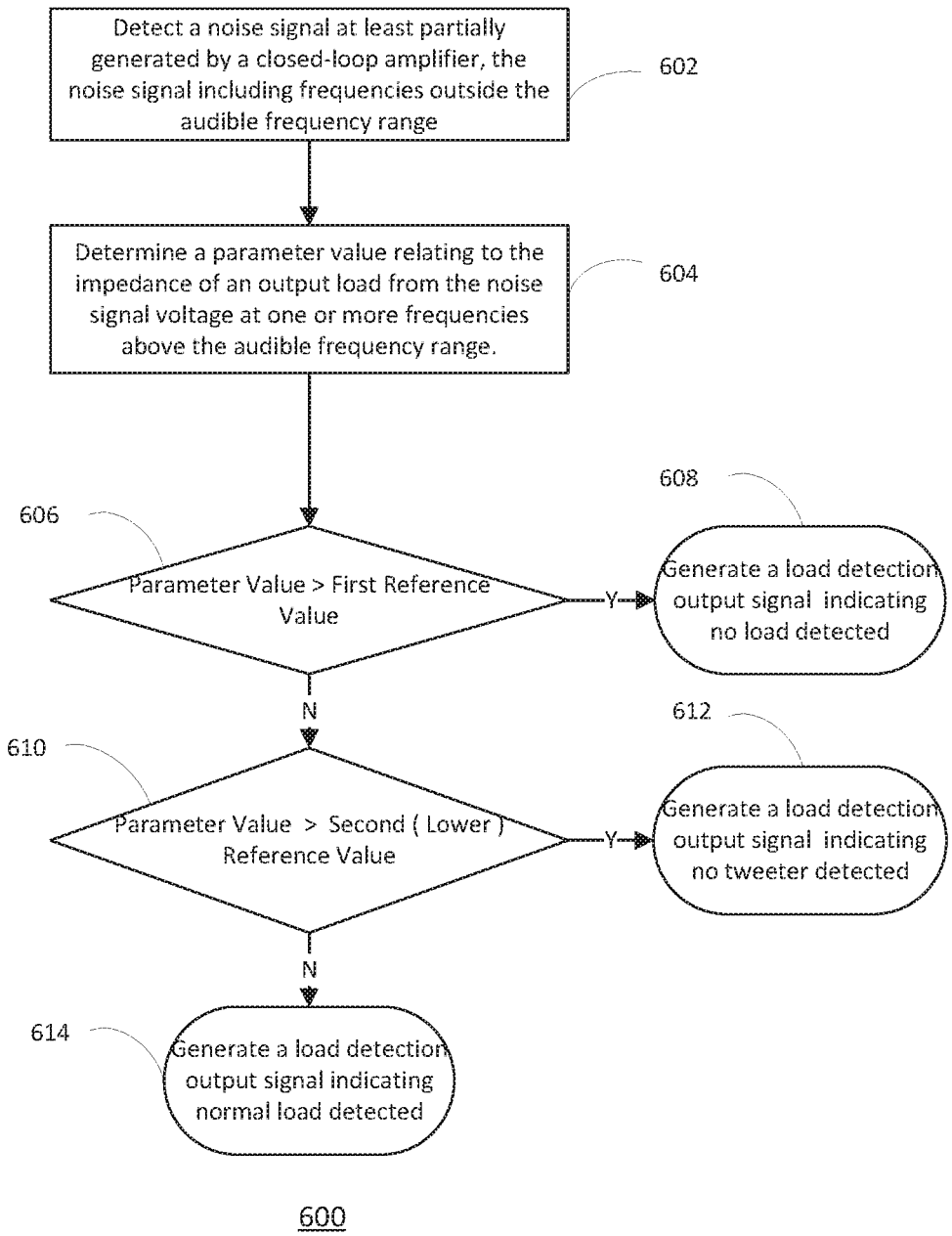
FIG. 8 shows a method of load detection for an audio system including a closed-loop class-D amplifier.

FIG. 8 illustrates a method of load detection 600 for an audio system including a closed-loop amplifier from a noise voltage signal. In step 602 noise signal is detected at least partially generated by a closed-loop amplifier, the noise signal including frequencies outside the audible frequency range. In step 604 a parameter relating to the impedance of an output load of the amplifier may be determined from the detected noise signal voltage. This parameter value may be a value of voltage measured at one or more frequencies above the audible frequency range. In step 606, a comparison may be made between the parameter value and a first reference value corresponding to a first threshold voltage value. If the parameter value is greater than the first reference value, a load detection output signal may be generated indicating no load is detected in step 608. If the parameter value is not greater than the first reference value the method moves to step 610.

In step 610 a comparison may be made between the parameter value and a second reference value corresponding to a second lower threshold voltage value. If the parameter value is greater than the second reference value, a load detection output signal may be generated indicating no tweeter is detected in step 612. If the parameter value is not greater the method moves to step 614, and a load detection output signal may be generated indicating a normal load is detected.

A load detector for an audio system comprising a closed-loop amplifier is described. The load detector includes a noise detector configured to be coupled to the output of the closed-loop amplifier. The noise detector detects a noise signal at least partially generated by the amplifier. The generated noise signal comprises frequencies outside the audible frequency range due to the noise shaping of the amplifier. The load detector further includes a parameter calculation module having an input coupled to the output of the noise detector and an output. The parameter calculation module is configured to determine a parameter value relating to an impedance of the amplifier output load from the detected noise signal and to output a load detection signal dependent on the determined parameter value. The load detector may detect the presence of a load such as a tweeter without generating a reference signal.

The load detector and method of load detection described herein may be included in audio systems. The audio systems including the load detector may be included in cars or other motor vehicles.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness, it is also stated that the term "comprising" does not exclude other elements or steps, the term "a" or "an" does not exclude a plurality, a single processor or other unit may fulfil the functions of several

What is claimed is:

1. A load detector for an audio system comprising a closed-loop amplifier, the closed-loop amplifier including an amplifier coupled to a noise shaper in a closed-loop configuration, the load detector comprising:
a noise detector configured to be coupled to an output of the closed-loop amplifier and to detect a noise signal at least partially generated by the amplifier, the noise signal comprising frequencies outside an audible frequency range; and
a parameter calculation module having an input coupled to the output of the noise detector and an output, wherein the parameter calculation module is configured to determine a parameter value relating to an impedance of an amplifier output load from the detected noise signal and to output a load detection signal dependent on the determined parameter value.

2. The load detector of claim 1 wherein the parameter value is determined from the detected noise signal in a frequency region above the audible frequency range.

3. The load detector of claim 1 wherein the noise detector comprises at least one of a voltage detector and a current detector and is configured to detect the noise signal by detecting at least one of an amplifier output current and output voltage and wherein the parameter calculation module is configured to determine the parameter value from at least one of the detected current and the detected voltage.

4. The load detector of claim 3 wherein the parameter calculation module is configured to compare the parameter value with a predetermined threshold value and to output the load detection signal dependent on the comparison.

5. The load detector of claim 3 wherein the parameter calculation module is further configured to determine a current value from the detected current and to determine the parameter value from the current value and a predetermined voltage value.

6. The load detector of claim 3 wherein the parameter calculation module further comprises an impedance calculator having an input coupled to the parameter calculation module input and a comparator having a first comparator input coupled to the impedance calculator output and a second comparator input coupled to a memory configured to store a reference parameter value, wherein the parameter calculation module is further configured to generate the load detection signal by comparing the parameter value with the reference parameter value.

7. The load detector of claim 3 wherein the controller is further configured to determine a voltage value from the detected voltage and to determine the parameter value from the voltage value and a predetermined voltage value.

8. The load detector of claim 1 configured to generate a load detection signal in response to at least one of no load being detected and no tweeter coupled to the output of the amplifier being detected.

9. An audio system comprising:
a closed-loop amplifier comprising an amplifier configured and arranged in a closed loop; and
a load detector coupled to an output of the closed-loop amplifier, the load detector comprising:
a noise detector configured to be coupled to the output of the closed-loop amplifier and to detect a noise signal at least partially generated by the closed-loop amplifier, the noise signal comprising frequencies outside an audible frequency range; and
a parameter calculation module having an input coupled to an output of the noise detector and an output, wherein the parameter calculation module is configured to determine a parameter value relating to an impedance of a closed-loop amplifier output load from the detected noise signal and to output a load detection signal dependent on the determined parameter value.

10. The audio system of claim 9 further comprising an audio processor having an input for receiving an audio signal and an output coupled to the closed-loop amplifier, wherein the audio processor is configured to modify the received audio signal in response to the load detection signal.

11. A method for detecting a load coupled to a closed-loop amplifier, the closed-loop amplifier including a noise shaper coupled to an amplifier in a configuration characterized as a closed loop, the method comprising:
detecting a noise signal at least partially generated by the amplifier, the noise signal comprising frequencies exceeding an audible frequency range;
determining a parameter value relating to an impedance of a load connected to the amplifier from the detected noise signal; and
generating a load detection signal dependent on the determined parameter value.

12. The method of claim 11 wherein detecting the noise signal comprises measuring at least one of an amplifier output current and amplifier output voltage.

13. The method of claim 12 wherein determining the parameter value comprises determining a current value from the measured amplifier output current at one or more frequencies above the audible frequency range.

14. The method of claim 13, further comprising determining the parameter value from the current value and a predetermined voltage value.

15. The method of claim 12 wherein determining the parameter value comprises determining a voltage value from the detected voltage at one or more frequencies above the audible frequency range.

16. The method of claim 12, further comprising determining a voltage value from the detected voltage and to determining the parameter value from the voltage value and a predetermined voltage value.

17. The method of claim 11 further comprising comparing the parameter value with at least one reference parameter value and generating a load detection output signal dependent on the comparison.

18. The method of claim 11, further comprising comparing the parameter value with a predetermined threshold value and outputting the load detection signal dependent on the comparison.

19. The method of claim 11, further comprising modifying a received audio signal at an input of the amplifier in response to the load detection signal.

20. The method of claim 11, wherein generating the load detection signal is determined in response to at least one of no load being detected and no tweeter coupled to the output of the amplifier being detected.

* * * * *